(12) United States Patent
Wei et al.

(10) Patent No.: US 9,196,710 B2
(45) Date of Patent: Nov. 24, 2015

(54) INTEGRATED CIRCUITS WITH RELAXED SILICON / GERMANIUM FINS

(71) Applicant: GLOBALFOUNDRIES, Inc., Grand Cayman (KY)

(72) Inventors: Andy Wei, Queensbury, NY (US); Jin Ping Liu, Hopewell Junction, NY (US); Shao Ming Koh, Clifton Park, NY (US); Amaury Gendron, San Jose, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/177,800

(22) Filed: Feb. 11, 2014

(65) Prior Publication Data

US 2015/0228755 A1    Aug. 13, 2015

(51) Int. Cl.
*H01L 21/336* (2006.01)
*H01L 29/66* (2006.01)
*H01L 21/8238* (2006.01)
*H01L 29/78* (2006.01)
*H01L 29/165* (2006.01)

(52) U.S. Cl.
CPC .... *H01L 29/6681* (2013.01); *H01L 21/823821* (2013.01); *H01L 29/165* (2013.01); *H01L 29/785* (2013.01)

(58) Field of Classification Search
USPC ......... 438/151, 157, 197, 199, 479, 752, 753, 438/933; 257/288–293, 527, 538, 401, 742, 257/E21.123
See application file for complete search history.

(56) References Cited

U.S. PATENT DOCUMENTS

| 7,531,393 | B2 * | 5/2009 | Doyle et al. | 438/151 |
| 8,871,584 | B2 * | 10/2014 | Tang et al. | 438/197 |
| 2011/0291188 | A1 * | 12/2011 | Cheng et al. | 257/347 |

* cited by examiner

*Primary Examiner* — Jasmine Clark
(74) *Attorney, Agent, or Firm* — Ingrassia Fisher & Lorenz, P.C.

(57) ABSTRACT

Integrated circuits with relaxed silicon and germanium fins and methods for fabricating such integrated circuits are provided. The method includes a forming a crystalline silicon and germanium composite layer overlying a crystalline silicon substrate, where a composite layer crystal lattice is relaxed. A fin is formed in the composite layer, and a gate is formed overlying the fin. A portion of the fin is removed on opposite sides of the gate to form a drain cavity and a source cavity, and a source and a drain are formed in the source cavity and drain cavity, respectively.

19 Claims, 10 Drawing Sheets

INTEGRATED CIRCUITS WITH RELAXED SILICON / GERMANIUM FINS

TECHNICAL FIELD

The technical field generally relates to integrated circuits and methods for fabricating integrated circuits, and more particularly relates to integrated circuits with finned field effect transistors where the fins are relaxed silicon/germanium.

BACKGROUND

Traditional finned field effect transistors (FinFETs) are produced using monocrystalline silicon as a semiconductor in the fin channel. Silicon germanium alloys have been used in the source and drain of "P" type FinFETs to induce a strained crystal lattice with higher electron mobility than in a relaxed crystal lattice. The germanium atom is larger than the silicon atom, so a germanium/silicon crystal structure grown over a silicon crystal structure is strained. However, the amount of crystal strain is limited as the width of the fin decreases, because the smaller area of the fin does not have sufficient strength or area to support a large crystal strain. Therefore, the benefits of a strained crystal lattice in very small FinFETs is reduced, but the overall induced fin stress levels are still very high. The concentration of germanium in the source and drain is also limited. The concentration of germanium can be graded from 0 to 100%, but a certain volume is required. If the concentration gradient is too large for a specified volume, the concentration gradient creates a strain that exceeds the capability of the crystal structure, so the crystal lattice fractures or breaks and the silicon/germanium crystal lattice relaxes. As the size of FinFETs are reduced, the volume of the source/drain decreases and thereby limits the germanium concentration gradient for the specified volume.

Metal contacts are typically used to make electrical connections to the surface of the source and drain. A potential energy barrier at the metal/semiconductor junction is called a Schottky barrier. The Schottky barrier requires a minimum voltage to be applied across the contact before any electrical current flows, and large Schottky barriers reduce the performance of the FinFET. The Schottky barrier for metal to germanium connections is significantly lower than the Schottky barrier for metal to silicon connections. Hence by increasing the germanium concentration at the surface of the source and drain where the electrical connection is made, FinFET performance can be improved. However, the desire to maintain a strained source and drain with a silicon fin prevents the production of a source and drain with high concentrations of germanium because, as described above, a high germanium concentration gradient over an insufficient volume breaks and relaxes the crystal structure.

FinFETs include the "N" type and the "P" type and different or altered process steps are used for each type. For example, "N" type FinFETs often use epitaxial growth to produce silicon fins while separate epitaxial growth steps are used to produce germanium and silicon fins for "P" type FinFETs. This results in a duplication of the epitaxial growth and related process steps to produce the FinFETs, which increases the cost and complexity of production. This also typically increases spacing requirements between "N" type and "P" type FinFETs, which undesirably increases the overall chip area.

Accordingly, it is desirable to develop methods and integrated circuits with similar structures for "N" type and "P" type FinFETs so the duplication of manufacturing steps can be limited. In addition, it is desirable to produce "P" type FinFETs with very high concentrations of germanium at the point where electrical contacts connect to the source and drain, so the Schottky barrier can be reduced. Furthermore, other desirable features and characteristics of the present embodiment will become apparent from the subsequent detailed description and the appended claims, taken in conjunction with the accompanying drawings and this background.

BRIEF SUMMARY

Integrated circuits and methods for producing those integrated circuits are provided. In an exemplary embodiment, a method for producing integrated circuits includes forming a crystalline silicon and germanium composite layer overlying a crystalline silicon substrate, where a composite layer crystal lattice is relaxed. A fin is formed in the composite layer, and a gate is formed overlying the fin. A portion of the fin is removed on opposite sides of the gate to form a drain cavity and a source cavity, and a source and a drain are formed in the source cavity and drain cavity, respectively.

In another exemplary embodiment, a method for fabricating an integrated circuit includes forming a plurality of silicon and germanium fins overlying a silicon substrate, where a crystal lattice in the fins is relaxed. The fins are divided into N fins designated for "N" type finned field effect transistors, and P fins designated for "P" type finned field effect transistors. A plurality of dummy gates are formed overlying the fins, and a portion of the fins on opposite sides of the dummy gate are removed to form a plurality of source cavities and drain cavities. The N fins are masked, and a source and a drain are formed in the source cavity and the drain cavity, respectively, for the P fins, where the source and drain comprise crystalline silicon and germanium. The P fins are masked, and a source and a drain are formed in the source cavity and the drain cavity, respectively, for the N fins, wherein the source and drain comprise about 90 mass percent or more of crystalline silicon.

In yet another exemplary embodiment, an integrated circuit includes a fin having a crystalline silicon and germanium composite layer overlying a crystalline silicon substrate. The crystalline silicon and germanium in the composite layer of the fin is relaxed. A gate overlies the fin, and a source and a drain are coupled to the composite layer. The source and drain are crystalline silicon with a source crystal lattice and a drain crystal lattice that is strained.

BRIEF DESCRIPTION OF THE DRAWINGS

The various embodiments will hereinafter be described in conjunction with the following drawing figures, wherein like numerals denote like elements, and wherein:

FIGS. 1-11 illustrate an integrated circuit and methods for its fabrication in accordance with exemplary embodiments, wherein:

FIGS. 1-2, 5-9, and 11 illustrate the integrated circuit and method in cross sectional views; and FIGS. 3-4 and 10 illustrate the integrated circuit and method in perspective sectional views.

DETAILED DESCRIPTION

The following detailed description is merely exemplary in nature and is not intended to limit the application and uses of the embodiment described. Furthermore, there is no intention to be bound by any theory presented in the preceding background or the following detailed description.

Traditionally, silicon fins have been used for "N" type finned field effect transistors (FinFETs), and mixed silicon and germanium (Si/Ge) fins have been used for "P" type FinFETs. This requires masking the "N" type FinFET areas while producing fins for the "P" type FinFETs, and vice versa. The embodiments herein contemplate a silicon germanium fin for both the "N" and "P" type FinFETs, which reduces the number of manufacturing steps required. The crystalline lattice in the silicon germanium fin is relaxed during the manufacturing process. After a gate structure is formed over the fin, adjacent areas of the fin are removed to form a source cavity and a drain cavity. The source and drain (S/D) are then epitaxially grown in the source cavity and the drain cavity. The S/D for the "N" type FinFETs are formed using silicon, so the S/D are strained because the smaller silicon atoms form a crystalline lattice from the relaxed silicon germanium crystal in the fin. The strained S/D improves the electron mobility and performance in the "N" type FinFETs. Many different methods are known for forming the contacts on silicon, and a method that produces a relatively low Schottky barrier can be used. The S/D for the "P" type FinFETs are formed from silicon and germanium with a germanium concentration gradient such that the surfaces of the S/D are essentially pure germanium. Pure germanium does not produce a significant Schottky barrier with most metals, which allows for an improved electrical connection between the S/D and a metallic contact.

Figure 1:
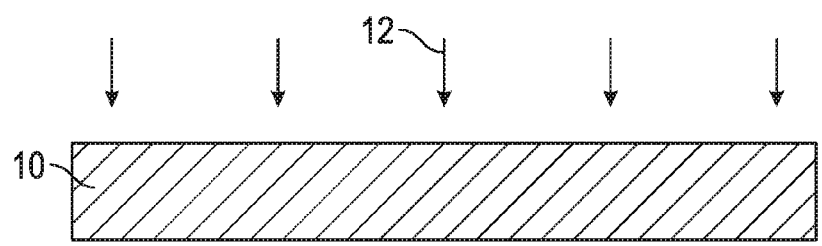

Referring first to FIG. 1, a substrate 10 is provided. As used herein, the term "substrate" 10 will be used to encompass semiconductor materials conventionally used in the semiconductor industry from which to make electrical devices. Semiconductor materials include monocrystalline silicon materials, such as the relatively pure (95 mass percent silicon or higher) or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the substrate 10 is monocrystalline silicon, such as a bulk silicon wafer (as illustrated.)

A substrate dopant 12 is implanted into the substrate 10, such as by diffusion or ion implantation. For diffusion, the substrate dopant 12 is placed on or just within the substrate 10 and then diffused into the substrate 10 with heat, and ions are implanted into the substrate 10 under the influence of an electrical field in ion implantation. Ion implantation is followed by an annealing step in some embodiments. For a "P" type FinFET, the substrate 10 is typically doped with arsenic or phosphorous, but antimony or other materials can also be used. The substrate 10 for an "N" type FinFET is typically doped with boron, but aluminum, gallium, indium, or other materials can also be used. The substrate dopant 12 serves to isolate the fins of adjacent FinFETs by preventing electrical current from flowing between adjacent fins through the substrate 10. A mask (not shown) can be used to isolate selected areas, so different substrate dopants 12 can be used for "P" and "N" type FinFET areas.

Figure 2:
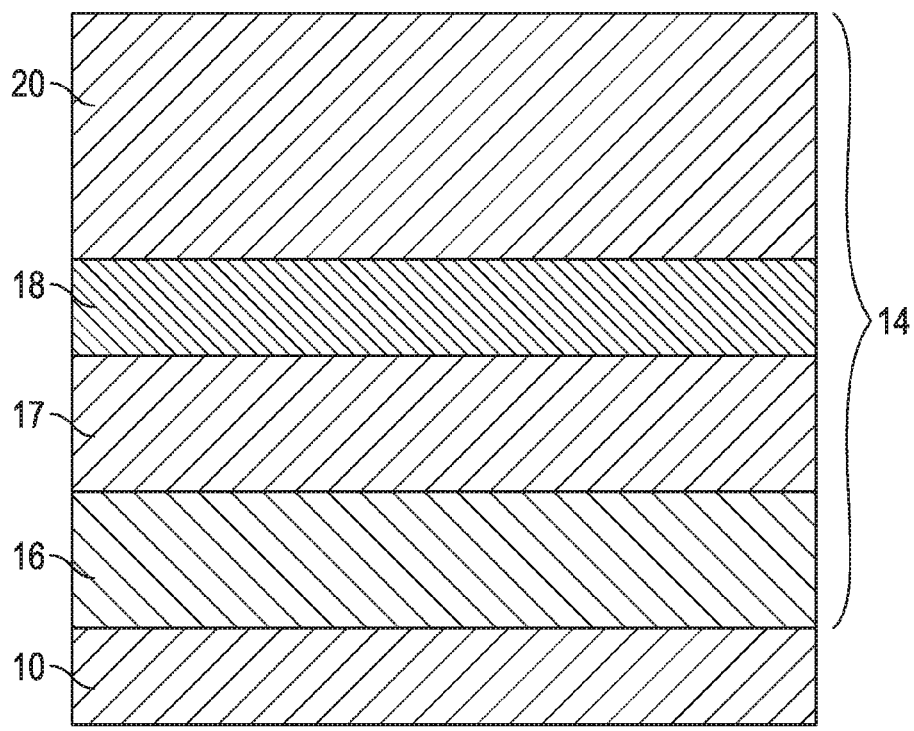

Reference is now made to FIG. 2. A composite layer 14 is formed overlying the substrate 10. As used herein, the term "overlying" means "over" such that an intervening layer may lie between the composite layer 14 and the substrate 10, and "on" such the composite layer 14 physically contacts the substrate 10. The composite layer 14 includes crystalline silicon and germanium, and the germanium may be present from about 10 mass percent to about 35 mass percent. In an exemplary embodiment, the composite layer 14 is formed by epitaxial growth from the substrate 10, such as by chemical vapor deposition or molecular beam epitaxy where the substrate 10 is exposed to reactive gases or beams of atomic germanium and silicon. Ionized doping materials can be added if desired.

There is a normal crystalline interatomic distance in silicon, with a natural lattice spacing of about 5.4 angstroms. The crystalline silicon in the substrate 10 is "relaxed," which means the atoms in the crystal (silicon atoms) are at the natural crystalline interatomic distance for silicon. Germanium can be freely substituted into the crystal structure at any concentration, but the germanium atom is larger than the silicon atom. Therefore, the natural crystalline interatomic distance in a crystal of silicon mixed with germanium is larger than the natural interatomic distance in a pure silicon crystal. When a silicon germanium crystal is grown on a pure silicon crystal, the crystal structure of the silicon germanium is strained because the interatomic distances in the pure silicon crystal are incorporated into the silicon germanium crystal. The larger germanium atoms produce larger natural interatomic distances in the crystal, but the crystal structure of the silicon substrate 10 prevents the silicon germanium crystal from forming at its larger natural interatomic distance. Therefore, the silicon germanium crystal is distorted parallel to the direction of growth, which is a compressive strain.

The composite layer 14 includes a relaxation layer 16, a relaxed low defect layer 17, a super steep retrograde well 18, and a composite fin layer 20. The relaxation layer 16 is formed first, and begins with a strained crystal lattice because it includes a higher concentration of germanium atoms than the substrate 10. The amount of strain is adjusted by varying the concentration of germanium in the relaxation layer 16. In an exemplary embodiment, the relaxation layer 16 is about 25 mass percent germanium and about 75 mass percent silicon, and the substrate 10 is about zero percent germanium. The crystal lattice of the relaxation layer 16 is relaxed, such as by thermal treatment at about 850 degrees centigrade (° C.) for about 10 minutes in a nitrogen atmosphere after it is formed. In an alternate embodiment, the relaxation layer 16 is grown in compositionally graded layers (not shown), where the first layer has a relatively low concentration of germanium and the last layer has the final concentration of germanium. The compositionally graded layers will naturally relax as the depth increases, so the lower portion will be more strained than the upper portion of each layer. In an exemplary embodiment, a series of compositionally graded layers that increase the germanium concentration by about 6 to about 10 mass percent over the underlying layer are grown to a depth of about 0.5 to about 1 micrometers, such that the upper surface of the top compositionally graded layer is essentially relaxed. Other methods for relaxing the relaxation layer 16 also exist, such as by ion implantation. Relaxation causes a break in the crystal lattice between the relaxation layer 16 and the substrate 10, so the crystal lattice of the relaxation layer 16 will form based on the natural crystalline interatomic distance for the concentration of silicon and germanium used.

The relaxation layer 16 has several defects, so a relaxed low defect layer 17 is formed overlying the relaxation layer 16. The relaxed low defect layer 17 is formed after the relaxation layer 16 has been relaxed, and can be formed by epitaxial growth, as described above. The epitaxial growth of the relaxed low defect layer 17 forms a monocrystalline structure, so the crystalline defects in the relaxation layer 16 do not appear the relaxed low defect layer 17. The relaxed low defect layer 17 has a silicon and germanium concentration similar to the upper surface of the relaxation layer 16, such as about 25 mass percent germanium in an exemplary embodiment.

The super steep retrograde well 18 is formed overlying the relaxation layer 16 and the relaxed low defect layer 17, such as by epitaxial growth as described above. The super steep retrograde well 18 includes silicon and germanium at a concentration similar to the relaxed low defect layer 17, so the crystal lattice of the super steep retrograde well 18 is relaxed. The super steep retrograde well 18 is doped with carbon and forms a barrier to dopant ion movement, where the carbon is positioned in the interstitial spaces in the crystal lattice. The super steep retrograde well 18 can be doped with carbon using ion implantation, epitaxy, or diffusion, as described above. The super steep retrograde well 18 prevents dopant ion movement from the substrate into the composite fin layer 20. The composite fin layer 20 will become the channel of the FinFET, so uncontrolled dopant ion movement into the composite fin layer 20 is not desired.

The composite fin layer 20 is then formed overlying the super steep retrograde well 18. The composite fin layer 20 includes silicon and germanium at a concentration similar to the super steep retrograde well 18 and the relaxed low defect layer 17, so the crystal lattice of the composite fin layer 20 is essentially relaxed. Each component of the composite layer 14 (the relaxation layer 16, the relaxed low defect layer 17, the super steep retrograde well 18, and the composite fin layer 20) has similar concentrations of silicon and germanium, so the entire composite layer 14 is essentially relaxed, with the exception that the relaxation layer 16 may include a concentration gradient in some embodiments.

Figure 3:
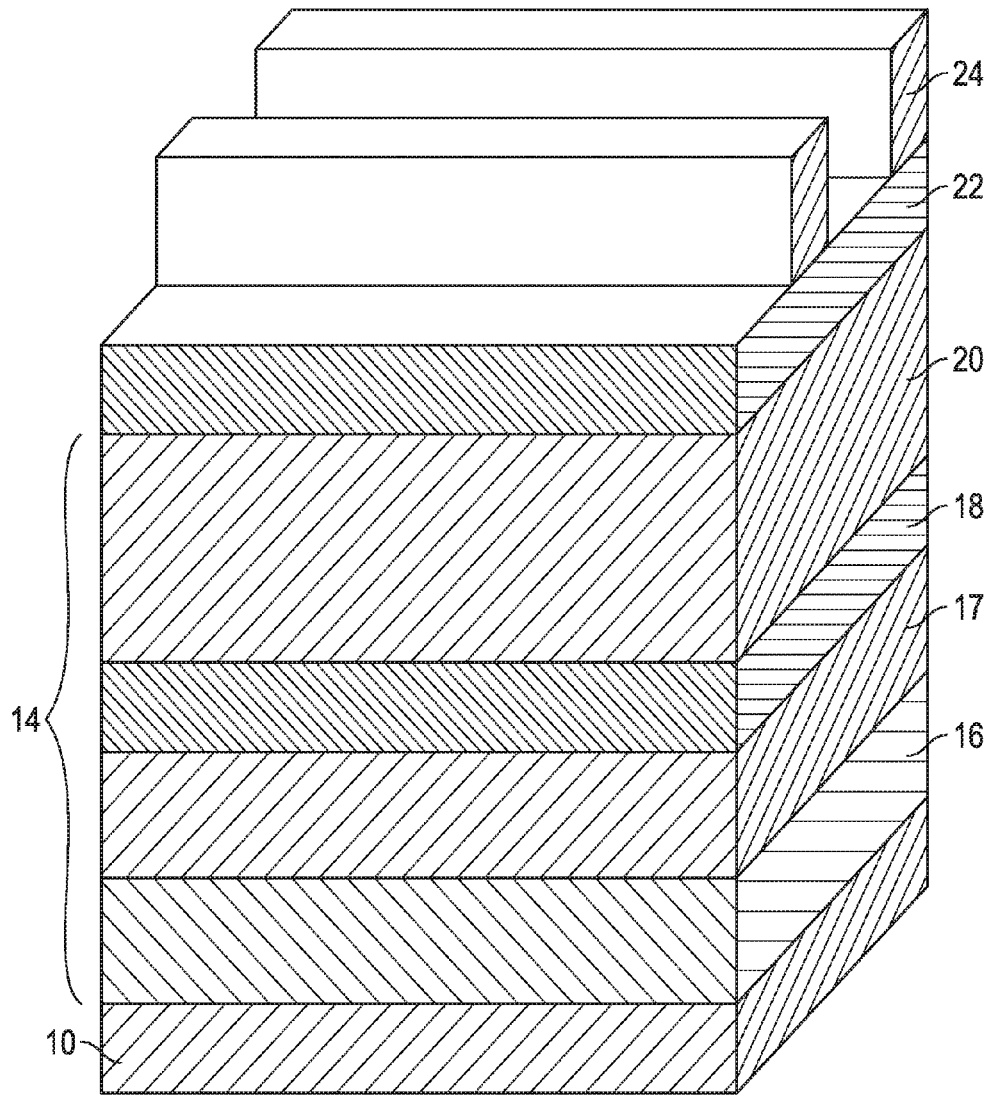

Referring now to the exemplary embodiment illustrated in FIG. 3, a fin hard mask 22 is formed overlying the composite layer 14. The fin hard mask 22 is formed by depositing silicon nitride, such as by reacting ammonia and dichlorosilane in a low pressure chemical vapor deposition furnace. A fin photoresist layer 24 is then formed overlying the fin hard mask 22, and patterned and developed for the formation of a plurality of fins. In an exemplary embodiment, the fin photoresist layer 24 (and other photoresist layers described below) is deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the fin photoresist layer 24 remains overlying desired locations of the fin hard mask 22.

Figure 4:
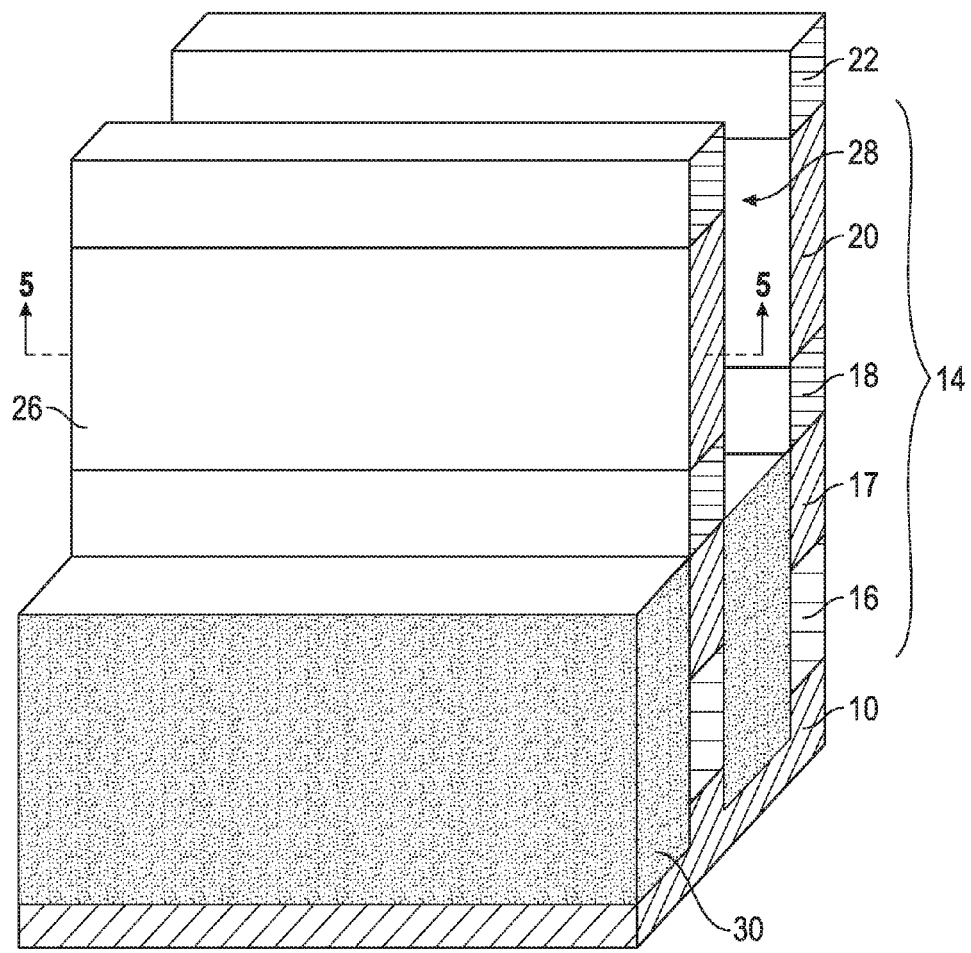

A plurality of fins 26 are then formed in the composite layer 14, as illustrated in FIG. 4, with continuing reference to FIG. 3. The fins 26 extend into the substrate 10 underlying the composite layer 14 in some embodiments, but the fins 26 are entirely within the composite layer 14 in other embodiments. A trench 28 is formed between adjacent fins 26 by anisotropically etching the material between the fins 26. The fin photoresist layer 24 is removed before or after the etching process, such as with an oxygen containing plasma. In an exemplary embodiment, a plasma etch with hydrogen and nitrogen trifluoride ($NF_3$) removes the portions of the fin hard mask 22 that are not covered by the fin photoresist layer 24, and the remainder of the trench 28 is formed with a reactive ion etch using carbon tetrachloride. A trench insulator 30 is then formed in the trench 28 to separate adjacent fins 26. In an exemplary embodiment, the trench insulator 30 is formed by blanket depositing silicon oxide over the trench 28 and the fin 26, followed by chemical mechanical planarization to smooth the surface and remove excess silicon oxide extending above the fins 26. The silicon oxide is then selectively etched to the desired level within the trench 28 to form the trench insulator 30. Silicon oxide can be deposited, for example, by chemical vapor deposition using silane and oxygen, and can be selectively etched with buffered hydrofluoric acid, such as ammonium fluoride mixed with hydrofluoric acid.

Figure 5:
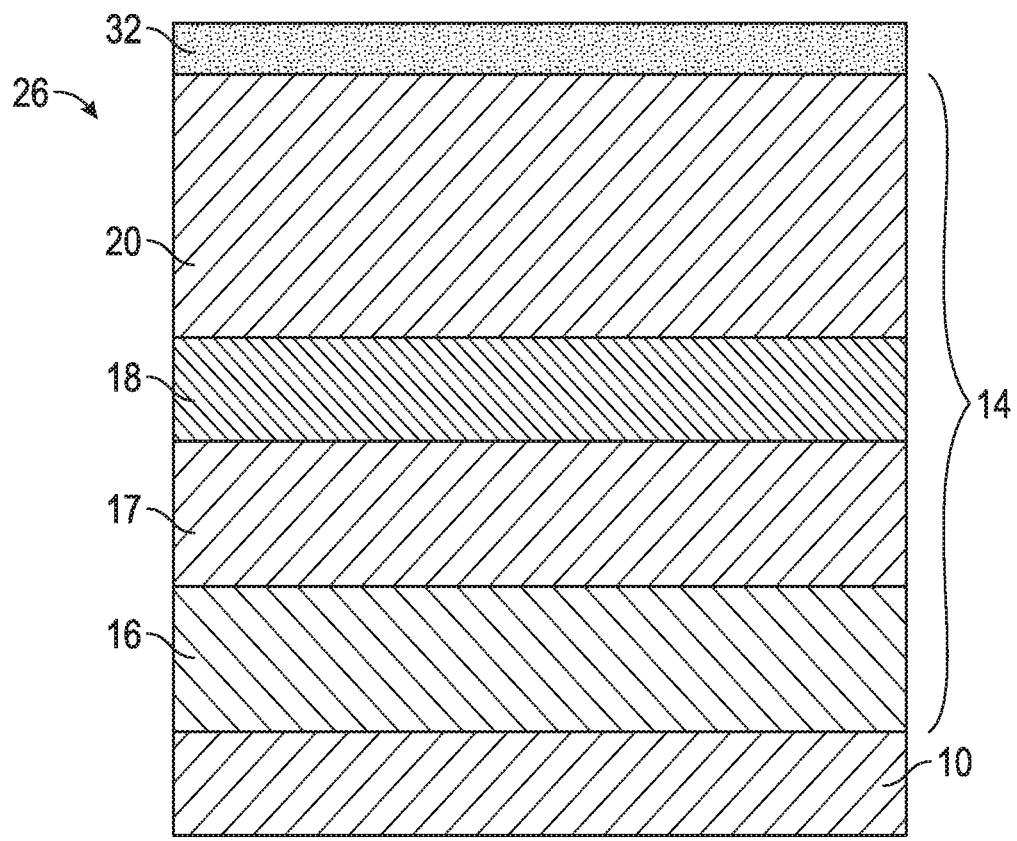

Reference is now made to FIG. 5, which is a cross sectional view of a fin 26, with continuing reference to FIG. 4. FIG. 5 is illustrated along axis 5-5 from FIG. 4. The fin hard mask 22 is removed, such as with a wet etch using hot phosphoric acid, and then a gate insulator 32 is formed overlying the fins 26. The gate insulator 32 can be silicon oxide formed by oxidizing the surface of the fins 26 in a water and oxygen ambient at about 900° C. to about 1,200° C., or a gate insulator 32 can be deposited, such as a silicon oxide layer deposited by chemical vapor or atomic layer deposition using silane and oxygen.

Figure 6:
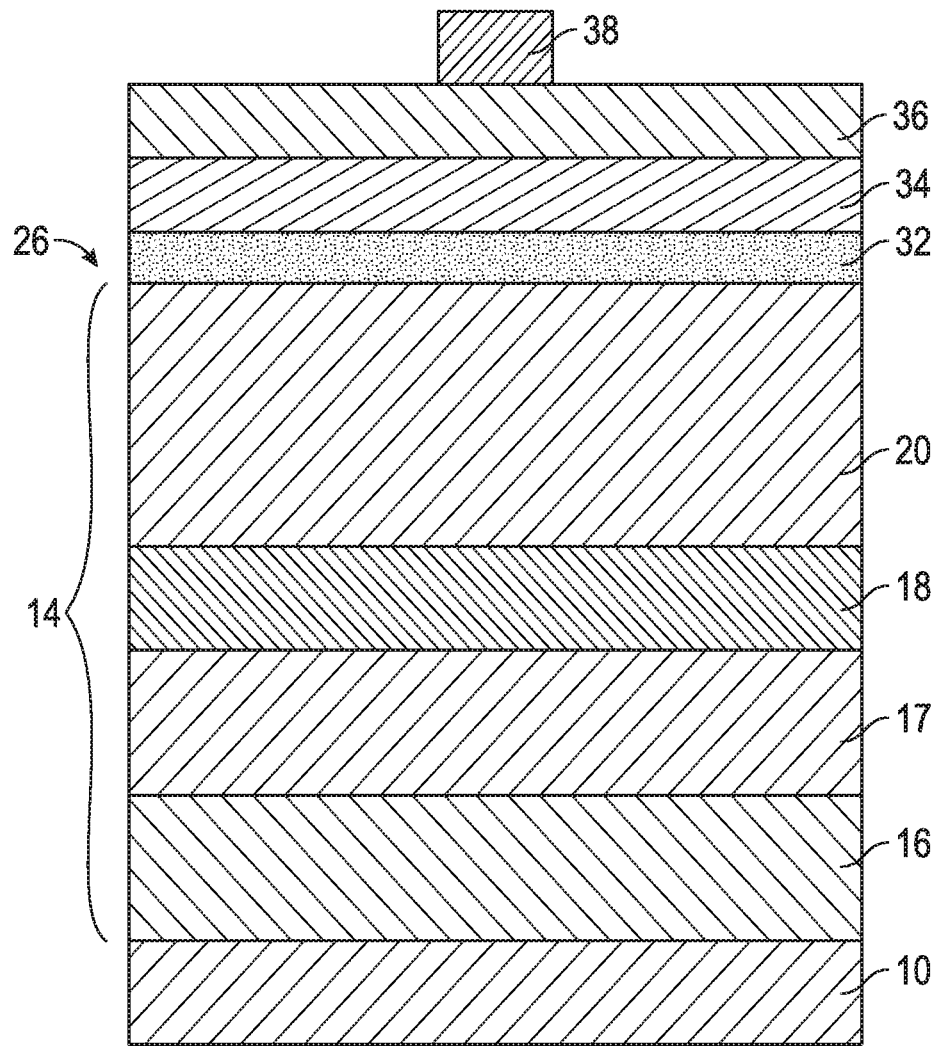

Referring now to an exemplary embodiment illustrated in FIG. 6, a dummy gate layer 34 of polysilicon is deposited overlying the gate insulator 32, such as by low pressure chemical vapor deposition using silane. A gate hard mask 36 of silicon nitride is deposited overlying the dummy gate layer 34, and a gate photoresist layer 38 is deposited and patterned overlying the gate hard mask 36, as described above. The gate photoresist layer 38 is patterned to remain over the areas where a gate for the transistor will be located. The exposed portions of the gate hard mask 36 are then removed by selective etching, as described above. In alternate embodiments, a permanent gate is formed instead of a dummy gate.

Figure 7:
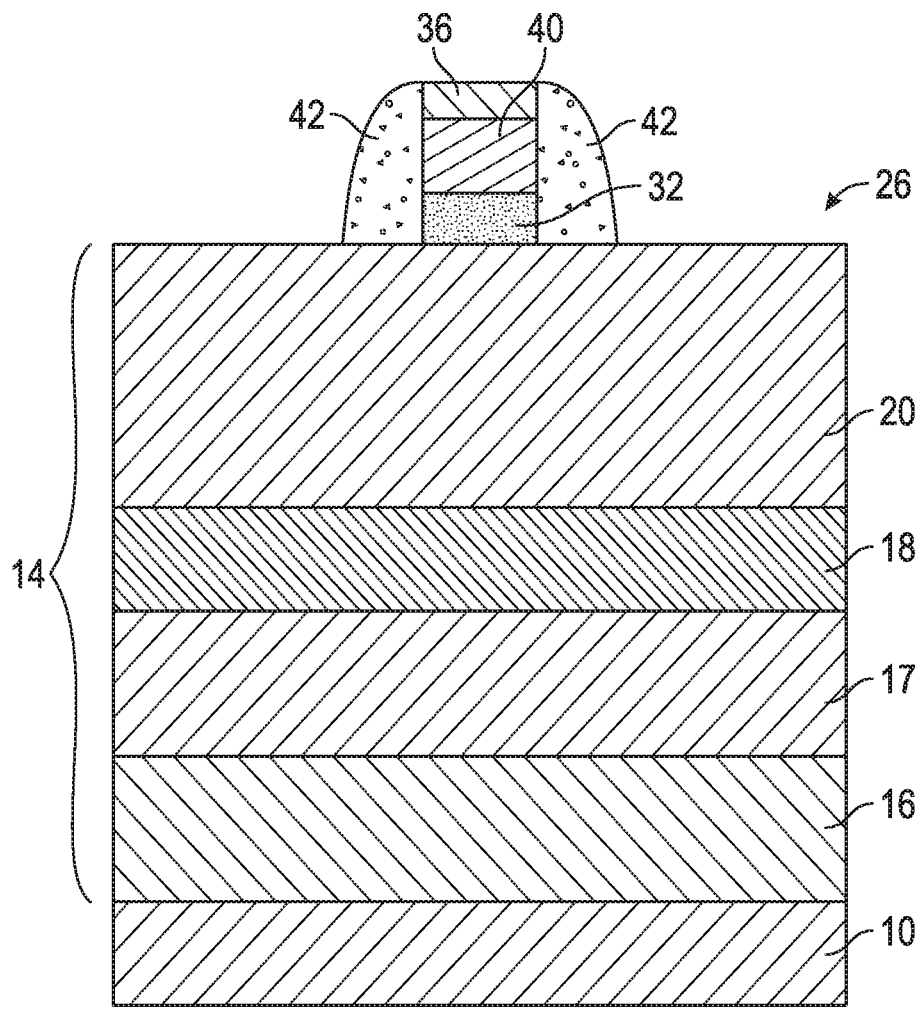

A dummy gate 40 is formed overlying the gate insulator 32 by removing the gate hard mask 36 and the dummy gate layer 34 where the gate photoresist layer 38 was removed, as illustrated in FIG. 7 with continuing reference to FIG. 6. The gate insulator 32 is also removed where the gate photoresist was removed, such as with a buffered hydrofluoric acid etch as described above. Gate spacers 42 are then formed on opposite sides of the dummy gate 40, and the gate hard mask 36 is left in place overlying the dummy gate 40. The gate spacers 42 can be formed by blanket depositing silicon nitride followed by an anisotropic etch of the deposited silicon nitride, which leaves the vertical portions adjacent to the dummy gate 40 as the gate spacers 42. Silicon nitride can be deposited by low pressure chemical vapor deposition using ammonia and silane, and a dry plasma etch with hydrogen and nitrogen trifluoride will anisotropically remove the silicon nitride. The silicon nitride anisotropic etch is stopped before the gate hard mask 36 is etched from over the dummy gate 40. The dummy gate 40 extends over the top and along the sides of the fin 26, so these areas are covered by the dummy gate 40.

Figure 8:
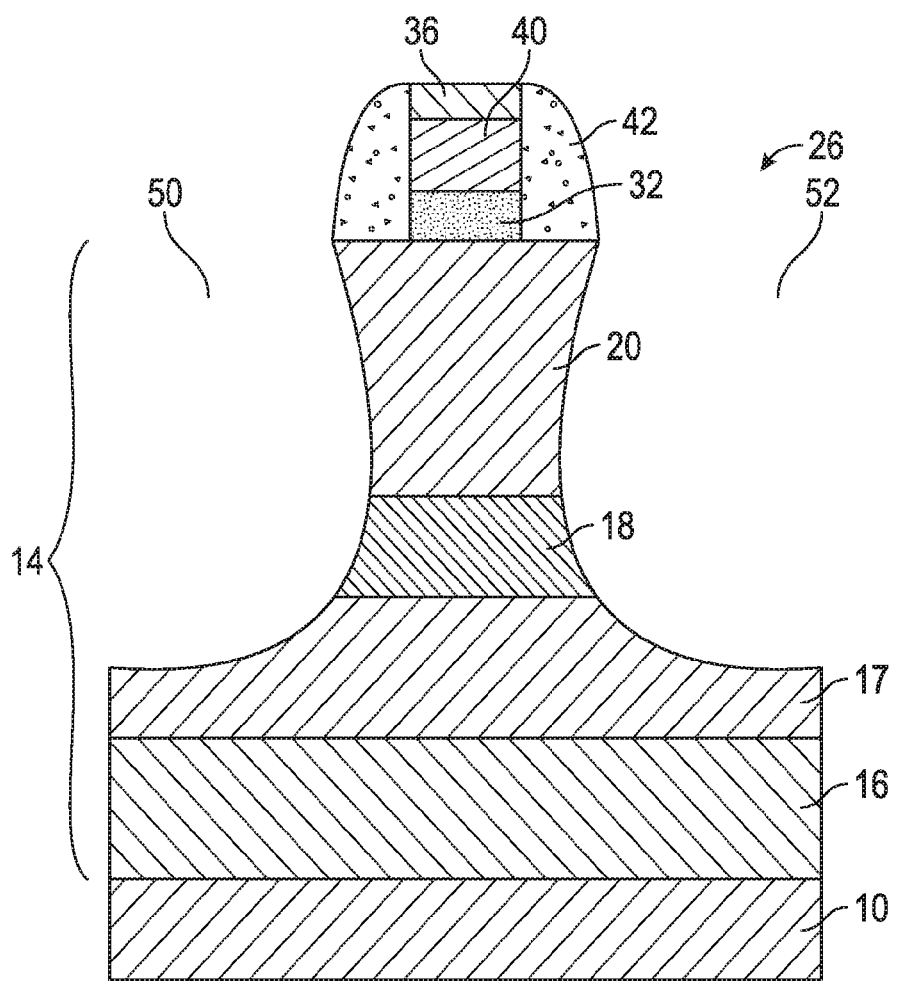

Reference is now made to the exemplary embodiment in FIG. 8. A source cavity 50 and a drain cavity 52 are formed on opposite sides of the dummy gate 40 by etching the composite layer 14 in the fin 26, such as with a wet etch using nitric acid, water, and ammonium fluoride. Alternatively, a reactive ion etch or other etching chemistries could be used. The dummy gate 40 covers a portion of the fin 26, so the fin 26 underlying the dummy gate 40 remains in place. Some of the fin 26 may be etched away from under the dummy gate 40 and the gate spacers 42, but much of the fin 26 protected by the dummy gate 40 remains in place. In an alternate embodiment, a hard mask and photoresist (not shown) can be used to extend the portion of the fin 26 protected from the etch, if desired. The source cavity 50 and drain cavity 52 may extend through the super steep retrograde well 18, but the etch is stopped before penetrating the relaxed low defect layer 17 such that the source and drain cavities 50, 52 do not extend into the relaxation layer 16. The crystal defects in the relaxation layer 16 are not desired in the source and drain cavities 50, 52. Therefore, at least a portion of the relaxed low defect layer 17, which is a portion of the composite layer 14, remains between the substrate 10 and the source and drain cavities 50, 52. As described above, the composite layer 14 includes silicon and germanium, so the source cavity 50 and drain cavity 52 are adjacent to a relaxed composite of silicon and germanium on the bottom and adjacent to the portion of the fin 26 underlying the dummy gate 40, and that relaxed composite has low crystal defects.

Figure 9:
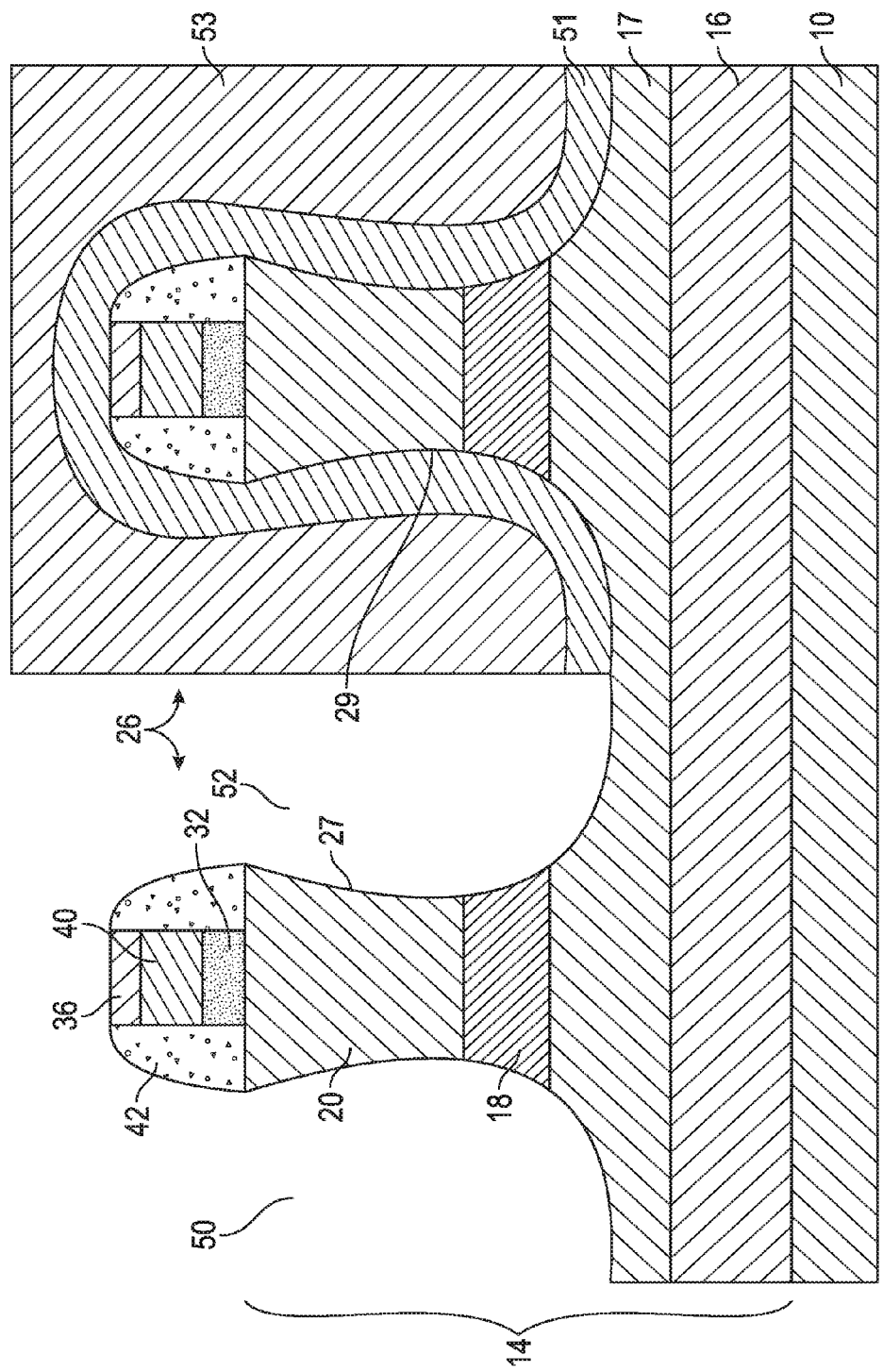

Reference is now made to FIG. 9. Some of the plurality of fins 26 are designated as P fins 27 for "P" type finned field effect transistors (P FinFETs), and some of the plurality of fins 26 are designated N fins 29 for "N" type finned field effect transistors (N FinFETs). The N fins 29 and P fins 27 are optionally separated by a shallow trench isolation (not shown), which is formed using methods well known to those skilled in the art. The composite layer epitaxial growth process described above is the essentially the same for the P fins 27 and the N fins 29, so there is no need to mask fins for one type of FinFET while epitaxially growing the fin for the other type of FinFET. This eliminates any need to duplicate manufacturing steps for separate fins 26 for "N" and "P" type FinFETs. However, the source and drain for "N" and "P" type FinFETs are different, so one type is masked while the source and drain are formed for the other type. In an exemplary embodiment, the N fins 29 are masked first, but the P fins 27 are masked first in other embodiments. An isolation hard mask 51 is formed overlying all the fins 26, and an isolation photoresist layer 53 is formed overlying the isolation hard mask 51. The isolation hard mask 51 can be silicon nitride, which is formed as described above, and the isolation photoresist layer 53 is patterned to expose the P fins 27 and mask the N fins 29. The exposed isolation hard mask 51 is removed, such as with a plasma etch using hydrogen and nitrogen trifluoride (NF3) (as described above), and the isolation photoresist layer 53 is removed, such as with an oxygen containing plasma. The source and drain are then formed for the P fins 27 and the "P" type FinFETs, as more fully described below. After the source and drain for the P fins 27 are formed, the remaining isolation hard mask 51 over the N fins 29 is removed, such as with a plasma etch with hydrogen and nitrogen trifluoride (as described above.) The masking process is then repeated to mask the P fins 27 and form the source drain for the N fins 29.

Figure 10:
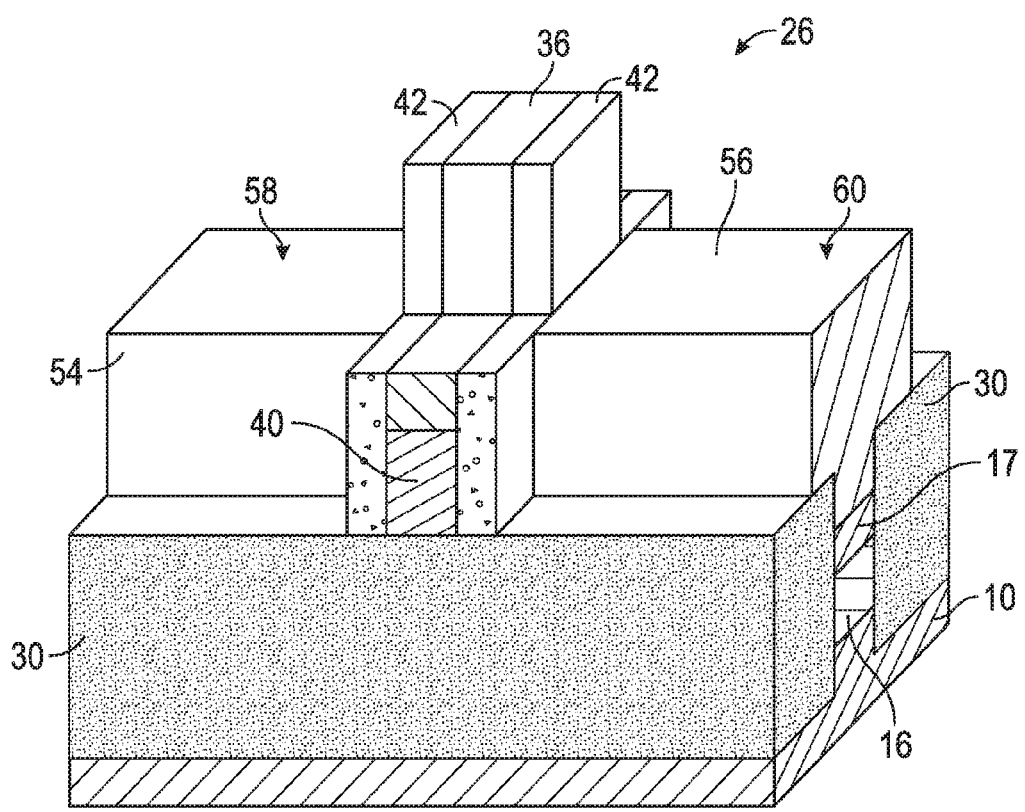

A plurality of sources 54 and drains 56 are then formed in the source cavities 50 and the drain cavities 52, as illustrated in FIG. 10 with continuing reference to FIGS. 8-9. In an exemplary embodiment, the source 54 and drain 56 are epitaxially grown from the silicon and germanium in the composite layer 14, so the source 54 and drain 56 are physically coupled to the composite layer 14. For an "N" type FinFET, the source 54 and drain 56 are epitaxially grown of silicon doped with phosphorus, arsenic, or other "N" type dopants. The source 54 and drain 56 can be epitaxially grown by passing a silicon source, such as a silane or silicon tetrachloride, over the heated composite layer 14 with ionized doping impurities added if desired. The monocrystalline source 54 has a strained source crystal lattice, and the drain 56 has a strained drain crystal lattice, because the silicon is epitaxially grown from a silicon/germanium material. This crystal lattice has a tensile strain, imparting tensile stress in the silicon germanium fin on the order of 0.7-1.5 gigapascals (GPa), which has about 70 to about 100 percent higher electron mobility than an unstrained silicon fin.

For the "P" type FinFETs, the source 54 and drain 56 are epitaxially grown of silicon and germanium with boron or other "P" type dopants. The source 54 and drain 56 can be epitaxially grown by chemical vapor deposition or molecular beam epitaxy, where the composite layer 14 is exposed to reactive gases or beams of atomic germanium and silicon, respectively, with ionized doping impurities added. A germanium concentration gradient is formed in the source 54 and drain 56 by increasing the concentration of atomic germanium during the epitaxial growth. In an exemplary embodiment, the germanium concentration begins at about 50 mass percent and increases to about 95 mass percent or greater in some embodiments, and increases to about 99 mass percent or greater in other embodiments. The composite layer 14 includes germanium, such as about 25 mass percent, so the source 54 and drain 56 can be grown with a strained crystal lattice using a higher initial germanium concentration than if they were grown from an essentially pure crystalline silicon base. The source 54 and drain 56 have a source surface 58 and a drain surface 60, respectively, so the germanium concentration at the source and drain surfaces 58, 60 is about 95 to about 99 mass percent or greater in various embodiments. In some embodiments, the germanium concentration is larger than in the composite layer 14, so the source crystal lattice and the drain crystal lattice may be strained in the "P" type FinFETs. In alternate embodiments, the source 54 and drain 56 for the "P" type FinFETs are relaxed because the concentration gradient is too steep to maintain the crystal lattice in a strained state and the crystal lattice breaks. The channel of relaxed germanium and silicon itself has slightly higher hole mobility than a silicon channel with a relaxed crystal lattice and is more sensitive to stress. Thus, a larger overall electron mobility boost can be obtained with the same level of strain on a silicon/germanium fin than for a comparable silicon fin.

Epitaxial growth builds on an existing crystalline lattice, so no growth occurs on the gate spacers 42 or the gate hard mask 36. The source 54 and drain 56 can be grown to be much wider than the fin 26. In some embodiments, the fin 26 is very thin, such as about 8 nanometers wide, so a wider source 54 and drain 56 facilitate improved contact alignment and electrical connections. It is much easier to align contacts and make electrical connections with the wider source 54 and drain 56 than with a narrow source 54 and drain 56.

Figure 11:
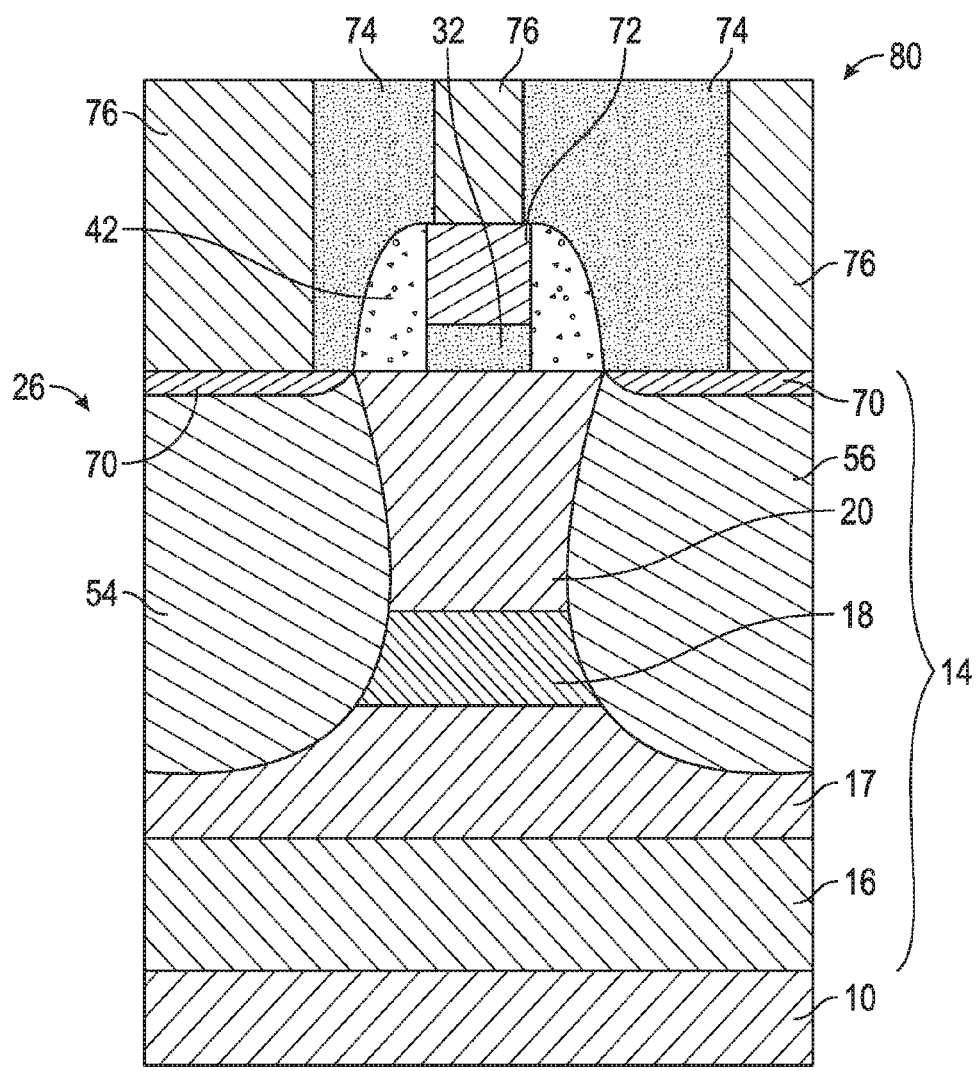

Reference is now made to an exemplary embodiment in FIG. 11, with continuing reference to FIGS. 8-10. The dummy gate 40 is removed and replaced with a replacement gate 72. In this regard, an interlayer dielectric 74 is deposited over the dummy gate 40, the source 54 and drain 56, and other areas, and the top portion of the interlayer dielectric 74 is then removed by chemical mechanical planarization. The chemical mechanical planarization continues until the gate hard mask 36 is removed from over the dummy gate 40, so the top surface of the dummy gate 40 is exposed. The dummy gate 40 is then selectively etched, such as with a hydrogen bromide plasma with about 3 percent oxygen. A replacement gate 72 is then formed in the space where the dummy gate 40 was located. The replacement gate 72 is formed using methods and techniques well known to those skilled in the art, and many different materials can be used, such as tungsten, aluminum, or titanium nitride. Any overburden can be removed with chemical mechanical planarization or selective etching. After the replacement gate 72 is in place, more interlayer dielectric 74 is deposited.

A contact layer 70 is formed at the source surface 58 and drain surface 60. In some embodiments, the contact layer 70 is a silicide, such as when the source and drain surfaces 58, 60 include significant concentrations of silicon, but in other embodiments the contact layer 70 is a metal germanide, such as when the source and drain surfaces 58, 60 are essentially germanium. A via (not shown) is formed through the interlayer dielectric 74 to expose the surfaces where an electrical connection is to be formed, such as the source and drain surfaces 58, 60 and the surface of the replacement gate 72. A thin layer of metal is deposited on the exposed surfaces, such as by sputtering or chemical vapor deposition, and the contact layer 70 is formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch may be used to remove the metal overburden, which does not react with materials other than silicon. For example, nickel can be selectively etched with a mixture of nitric acid, acetic acid, and sulfuric acid.

The contacts 76 are made with techniques well known to those skilled in the art. The contacts 76 are electrically connected to other electronic components to form an integrated circuit 80. The contacts 76 form an electrical connection with the contact layers 70 on the source 54 and drain 56. The source and drain surfaces 58, 60 for the "P" type FinFETs are essentially pure germanium, with a germanium concentration of greater than about 95 mass percent or about 99 mass percent, so there is a negligible Schottky barrier at the electrical connection between the contact 76 and the contact layer 70. For example a Schottky barrier of less than 0.1 volts is attained with metal contacts and contact layers formed on crystalline silicon germanium with a germanium concentration of greater than about 95 mass percent. This improves the performance over a source 54 and drain 56 with a higher concentration of silicon where the electrical connection to the contact is made.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method for producing an integrated circuit comprising:
    forming a composite layer overlying a substrate, wherein the composite layer comprises crystalline silicon and germanium and the substrate comprises crystalline silicon, and wherein a composite layer crystal lattice is relaxed;
    forming a fin from the composite layer;
    forming a gate overlying the fin;
    removing a portion of the fin on opposite sides of the gate to form a drain cavity and a source cavity; and
    forming a source in the source cavity and a drain in the drain cavity.

2. The method of claim 1 wherein forming the source and the drain further comprises forming the source and the drain such that the source and the drain comprise about 90 mass percent or more crystalline silicon, and wherein a source crystal lattice is strained and a drain crystal lattice is strained.

3. The method of claim 2 wherein forming the source and the drain further comprise forming the source and the drain with a dopant, wherein the dopant comprises one or more of phosphorus, arsenic, and antimony.

4. The method of claim 1 wherein forming the source and the drain further comprise forming the source and the drain such that the source and the drain comprise silicon and germanium, and wherein the germanium is about 50 mass percent or greater.

5. The method of claim 4 wherein forming the source and the drain further comprise forming the source and the drain with a concentration gradient of germanium, wherein a germanium concentration at a source surface and at a drain surface is greater than about 95 mass percent germanium.

6. The method of claim 4 wherein forming the source and the drain further comprise forming the source and the drain with a dopant, wherein the dopant comprises one or more of boron, aluminum, gallium, and indium.

7. The method of claim 1 wherein forming the composite layer further comprises;
    forming a relaxation layer comprising silicon and germanium;
    relaxing a relaxation crystal lattice structure; and
    forming a composite fin layer overlying the relaxation layer by epitaxial growth, wherein the composite fin layer comprises silicon and germanium.

8. The method of claim 7 wherein forming the composite layer further comprises:
    forming a relaxed low defect layer overlying the relaxation layer; and
    forming a super steep retrograde well overlying the relaxed low defect layer, wherein the super steep retrograde well comprises silicon, germanium, and carbon.

9. The method of claim 1 wherein forming the gate overlying the fin further comprises forming a dummy gate overlying the fin before forming the source and the drain; and
    replacing the dummy gate with a replacement metal gate.

10. The method of claim 1 wherein forming the fin further comprises forming a plurality of fins, the method further comprising:
    designating some of the fins as N fins and some of the fins as P fins; and
    wherein forming the source in the source cavity and the drain in the drain cavity further comprises alternately masking the N fins and the P fins prior to forming the source and the drain.

11. A method of producing an integrated circuit comprising:
    forming a plurality of fins overlying a substrate, wherein the fins comprises silicon and germanium, wherein the substrate comprises silicon, wherein a crystal lattice in the fins is relaxed, and wherein the fins are divided into N fins designated for "N" type finned field effect transistors and P fins designated for "P" type finned field effect transistors;
    forming a plurality of dummy gates overlying the fins;
    removing a portion of the fins on opposite sides of the dummy gates to form a plurality of source cavities and a plurality of drain cavities;
    masking the N fins;
    forming a source in the source cavity and a drain in the drain cavity for the P fins, wherein the source and the drain for the P fins comprises crystalline silicon and germanium;
    masking the P fins; and
    forming the source in the source cavity and the drain in the drain cavity for the N fins, wherein the source and the drain for the N fins comprise about 90 mass percent or more crystalline silicon.

12. The method of claim 11 wherein forming the plurality of fins further comprises:
   forming a composite layer overlying the substrate, wherein the composite layer comprises silicon and germanium; and
   forming the fins in the composite layer.

13. The method of claim 12 wherein removing the fins on opposite sides of the dummy gates further comprises leaving at least a portion of the composite layer underlying the source cavity and the drain cavity.

14. The method of claim 13 wherein producing the source in the source cavity and the drain in the drain cavity for the N fins further comprises epitaxially growing silicon in the source cavity and the drain cavity such that a source crystal lattice is strained and a drain crystal lattice is strained.

15. The method of claim 12 wherein forming the composite layer further comprises:
   forming a relaxation layer comprising silicon and germanium overlying the substrate;
   relaxing a stress relaxation crystal lattice structure; and
   forming a composite fin layer overlying the relaxation layer by epitaxial growth.

16. The method of claim 15 wherein forming the composite layer further comprises:
   forming a relaxed low defect layer overlying the relaxation layer; and
   forming a super steep retrograde well overlying the relaxed low defect layer, wherein the super steep retrograde well comprises silicon, germanium, and carbon.

17. The method of claim 16 wherein removing the fins on opposite sides of the dummy gates further comprises removing the super steep retrograde well.

18. The method of claim 11 wherein producing the source in the source cavity and the drain in the drain cavity for the P fins further comprises epitaxially growing silicon and germanium with a germanium concentration gradient such that a germanium concentration at a source surface is about 95 mass percent or more, and the germanium concentration at a drain surface is about 95 mass percent or more.

19. The method of claim 11 further comprising:
   forming a contact electrically connected to the source for the P fin, wherein a source to contact Schottky barrier is less than about 0.1 volts.

\* \* \* \* \*